United States Patent
Pfau

(10) Patent No.: US 8,356,932 B2
(45) Date of Patent: Jan. 22, 2013

(54) MANUFACTURING METHOD FOR A SENSOR OF A THERMAL FLOW MEASURING DEVICE

(75) Inventor: Alex Pfau, Arlesheim (CH)

(73) Assignee: Endress + Hauser Flowtec AG, Reinach (CH)

( * ) Notice: Subject to any disclaimer, the term of this patent is extended or adjusted under 35 U.S.C. 154(b) by 301 days.

(21) Appl. No.: 12/805,903

(22) Filed: Aug. 24, 2010

(65) Prior Publication Data

US 2011/0041597 A1 Feb. 24, 2011

Related U.S. Application Data

(60) Provisional application No. 61/236,362, filed on Aug. 24, 2009.

(30) Foreign Application Priority Data

Aug. 24, 2009 (DE) .......................... 10 2009 028 850

(51) Int. Cl.
 *G01K 17/00* (2006.01)
(52) U.S. Cl. ......................................................... 374/29
(58) Field of Classification Search ............... 73/204.22; 374/29
 See application file for complete search history.

(56) References Cited

U.S. PATENT DOCUMENTS

| 6,297,723 | B1 * | 10/2001 | Shoji et al. ...................... 338/28 |
| 6,971,274 | B2 | 12/2005 | Olin | |
| 7,197,953 | B2 * | 4/2007 | Olin ............................. 73/866.5 |

FOREIGN PATENT DOCUMENTS

| DE | 4123482 | 2/1992 |
| DE | 102008015359 | 9/2009 |
| GB | 1 503872 | 3/1978 |

\* cited by examiner

*Primary Examiner* — Lisa Caputo
*Assistant Examiner* — Jamel Williams
(74) *Attorney, Agent, or Firm* — Bacon & Thomas, PLLC

(57) ABSTRACT

A method for the manufacture of a sensor for a thermal flow measuring device, wherein the sensor has at least one housing with a first open end and a second open end. The first open end is securable in a sensor holder; and at least one resistance thermometer is inserted into the housing through the second open end of the housing and the second open end of the housing is closed. Cables for electrical contacting of the resistance thermometer lead out of the housing through the first open end of the housing.

3 Claims, 3 Drawing Sheets

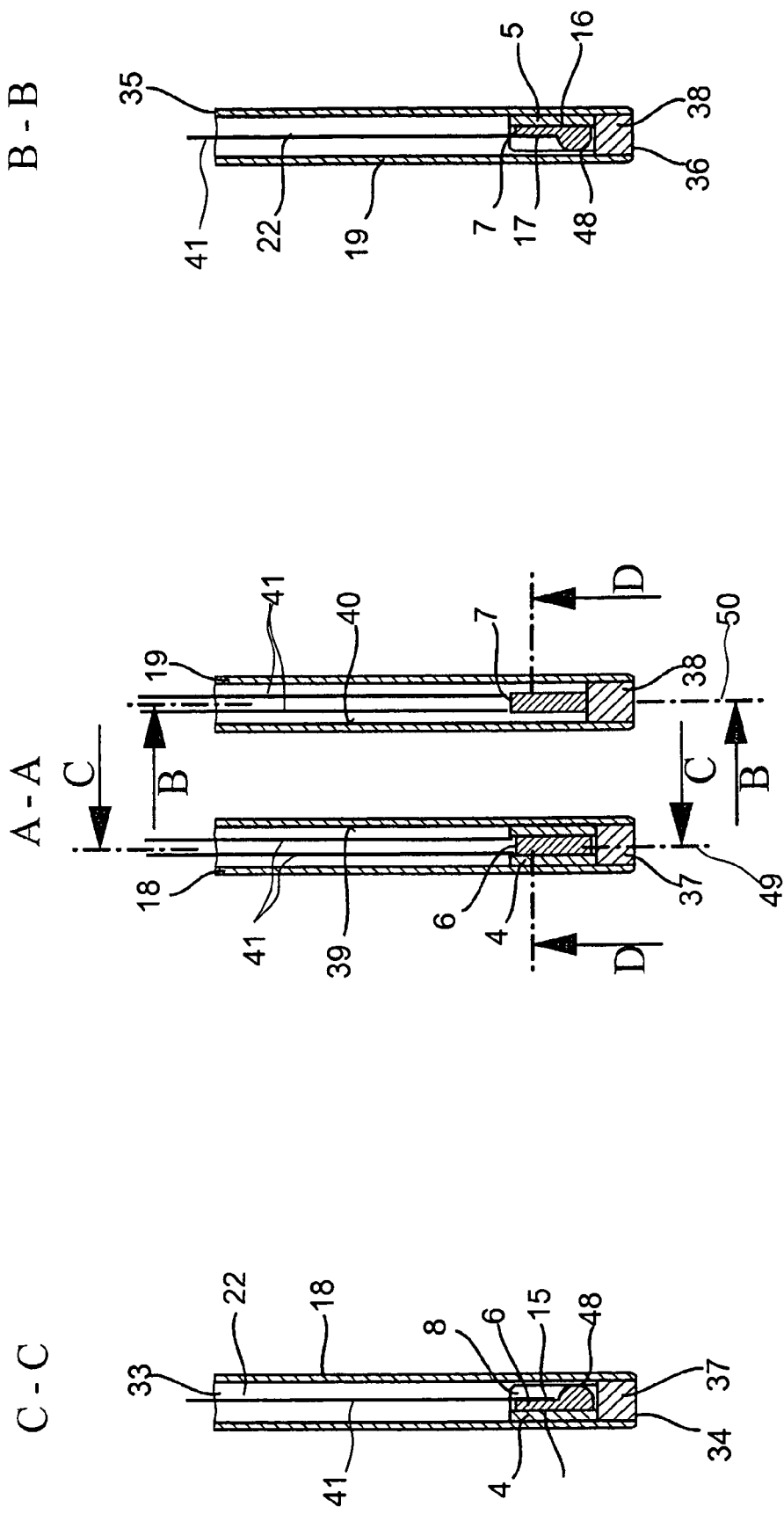

MANUFACTURING METHOD FOR A SENSOR OF A THERMAL FLOW MEASURING DEVICE

CROSS-REFERENCE TO RELATED APPLICATION

This application is a Nonprovisional which claims the benefit of U.S. Provisional Application No. 61/236,362 filed on 24 Aug. 2009.

TECHNICAL FIELD

The present invention relates to a method for manufacture of a sensor of a thermal flow measuring device having at least one shell housing with a first open end, wherein the first open end can be secured in a sensor holder, and wherein cables for electrical contacting of a resistance thermometer in the housing lead out from the housing through the first open end of the housing.

BACKGROUND DISCUSSION

Conventional thermal flow measuring devices use usually two (embodied to be as similar as possible) temperature sensors, which are arranged in (most often pin-shaped) metal-shell housings—so-called stingers—and which are in thermal contact with the medium, which is flowing through a measuring tube or through the pipeline. For industrial application, the two temperature sensors are usually installed in a measuring tube; the temperature sensors can, however, also be directly mounted in the pipeline. One of the two temperature sensors is a so-called active temperature sensor, which is heated by means of a heating unit. For this heating unit, either an additional resistance heating is provided, or the temperature sensor itself is a resistance element, e.g. an RTD (Resistance Temperature Device) sensor, which is heated through conversion of an electrical power, for example, through a corresponding variation of the electrical measuring current. The second temperature sensor is a so-called passive temperature sensor: It measures the temperature of the medium.

In a thermal flow measuring device, the heatable temperature sensor is usually heated in such a way, that a fixed temperature difference is set between the two temperature sensors. Alternatively, it has also been known to supply a constant heating power via a control unit, which may utilize either open or closed loop control.

If there is no flow in the measuring tube, an amount of heat, which is constant in time, is then required for maintaining the predetermined temperature difference. If, in contrast, the medium to be measured is moving, the cooling of the heated temperature sensor is essentially dependent on the mass flow of the medium flowing past. Since the medium is colder than the heated temperature sensor, heat is transported away from the heated temperature sensor by the flowing medium. Thus, in the case of a flowing medium, in order to maintain the fixed temperature difference between the two temperature sensors, an increased heating power is required for the heated temperature sensor. The increased heating power is a measure for the mass flow of the medium through the pipeline.

If, in contrast, a constant heating power is fed in, the temperature difference between the two temperature sensors then decreases as a result of the flow of the medium. The particular temperature difference then serves as a measure for the mass flow of the medium through the pipeline (or through the measuring tube).

There is, thus, a functional relationship between the heating energy needed for heating the temperature sensor, and the mass flow through a pipeline or through a measuring tube. In thermal flow measuring devices, the dependence of the heat transfer coefficient on the mass flow of the medium through the measuring tube (or through the pipeline) is utilized for determining the mass flow. Devices which operate according to this principle are available from and sold by the assignee under the name "t-switch", "t-trend" or "t-mass".

Until now, primarily RTD-elements with helically wound platinum wires have been employed in thermal flow measuring devices. In the case of thin-film resistance thermometers (TFRTDs), conventionally, a meander-shaped platinum layer is vapor deposited on a substrate. Over this, a glass layer is applied for protection of the platinum layer. The cross section of the thin-film resistance thermometers is rectangular, in contrast to the RTD-elements, which have a round cross section. Heat transfer into the resistance element and/or out of the resistance element accordingly occurs via two surfaces lying opposite each other, which, together, make up a large part of the total surface of a thin-film resistance thermometer.

In U.S. Pat. Nos. 6,971,274 and 7,197,953, installation of a cuboid-shaped, thin-film resistance thermometer in a round, pin-shaped, shell housing is achieved in the following way. Into a spacer socket (made of metal) with a rectangular recess, the thin-film resistance thermometer is inserted in such a way, that at least the two large surfaces of the thin-film resistance thermometer (which lie opposite each other) have virtually gap-free contact with the surfaces of the spacer socket lying opposite them. To this effect, the spacer socket has a rectangular recess, which is manufactured according to the outer dimensions of the thin-film resistance thermometer. The spacer socket should hold the thin-film resistance thermometer tightly. In this regard, the spacer socket and the thin-film resistance thermometer virtually form a press fit. The spacer socket itself and the pin-shaped housing likewise form a press fit. In this way, use of a potting compound or some other fill material is made unnecessary. The advantage of this construction is that, due to the spacer socket, a good heat transfer exists between the thin-film resistance thermometer and the measured medium on all sides. However, due to the fixed seating of the thin-film resistance thermometer and/or through different coefficients of thermal expansion for the participant materials, mechanical stresses arise in the thin-film resistance thermometer.

The patent application having PCT-Application No. PCT/EP2009/052942 and not yet published at the point in time of this present patent application discloses a method for manufacture of a temperature sensor (especially one for a thermal flow measuring device) having at least one tubular, pin-shaped housing with a first open end and a second open end (the first open end of the pin-shaped housing being held in a sensor holder), with, furthermore, at least one resistance thermometer, which has a first surface and at least a second surface which lies opposite the first surface, wherein a spacer with a resistance thermometer secured to the first surface of the spacer is inserted into the pin-shaped housing through the second open end of the pin-shaped housing, and the second open end of the pin-shaped housing is then closed with a plug.

SUMMARY OF THE INVENTION

An object of the invention is to provide a manufacturing process, by which a sensor for a thermal flow measuring device can be manufactured in a cost-effective manner.

The object is achieved by a method for manufacture of a sensor for a thermal flow measuring device, wherein the sensor has at least one housing with a first open end and a second open end, wherein the first open end can be secured in a sensor holder; wherein at least one resistance thermometer is inserted into the housing through the second open end of the housing, and the second open end of the housing is closed; wherein cables for electrical contacting of the resistance thermometer lead out from the housing through the first open end of the housing.

The object of the invention is furthermore achieved by a thermal flow measuring device sensor manufactured by the method of the invention.

If the housing has a bend, it becomes very difficult to fill the housing through its first open end, which, for example, can be secured in a sensor holder. Through the method of the invention, both helically wound RTD-elements as well as TFRTDs can easily be introduced into the housing and then, for example, potted. In this case, it is not of importance whether the resistance thermometer is the heated or unheated resistance thermometer of the thermal flow measuring device. Conventionally, the housing is tubular, i.e. it has an approximately circularly round cross section; however, other cross sections can also be manufactured with this method. If the pin-shaped housing is tubular and straight, it is called a pin-shaped housing.

In a first further development of the method of the invention, in the case of a closed second end of the housing, fill material is filled in through the first end of the housing. This fill material is thermally conductive material and/or thermally insulating material.

The fill material (e.g. a potting compound) is composed, for example, of a powdered form of a material with a low thermal conductivity, or of a heat insulating paste. Usually, an epoxy filling with a thermal conductivity of about 2 W/(mK) is used. In contrast to this, according to the invention, a material with a very high thermal conductivity can also be used. If the spacer has, for example, a bore, into which the resistance thermometer is inserted, wherein the spacer then surrounds the resistance thermometer on all sides, the intermediate space between the spacer and resistance thermometer, and, in given cases, other cavities in the spacer which are necessary for assembly, is/are filled with a heat conducting material. The housing is then filled with heat-insulating material from first end up to the spacer. In this embodiment, two different fill materials are thus put to use.

Especially advantageously, the spacer is composed of material which conducts heat well, e.g. copper or copper alloys. It can, for example, also be produced by sintering. Conventionally, the housing is made of stainless steel, e.g. from nickel-based alloys. Stainless steel usually has a rather low thermal conductivity. Thus, the thermal conductivity of X2CrNiMo 17-12-3 or 1.4404 lies at 15 W/(mK). For comparison, the thermal conductivity of pure copper lies at about 400 W/(mK).

The plug can be composed of heat-conducting or heat-insulating material, depending on application. However, it is preferably composed of material that conducts heat well. Suitable materials are sufficiently described in the state of the art. Among these are, above all, copper and copper alloys.

If the plug is made, for example, of copper, and the measured medium contacting the thermal flow measuring device should not, and/or is not permitted to, come in contact with copper, a cover is additionally to be placed between the measured medium and the plug as the terminal part of the second end of the housing, or a nickel layer is to be vapor deposited over the bare copper. In another variant, the plug is composed of stainless steel, especially of the same material as the housing. It thereby forms the terminal part of the second end of the housing.

Another further development of the method of the invention provides that the cables for electrical contacting of the resistance thermometer are connected with a control/evaluation unit, and that the sensor holder is connected with a measuring tube. Through the measuring tube flows the measured medium whose flow is to be ascertained. The sensor holder can also be connected with the control/evaluation unit, or it can even be identical to this (i.e. sensor holder and control/evaluation unit form an integral unit).

In an additional further development of the method of the invention, the resistance thermometer is a thin-film resistance thermometer (TFRTD). Thus, the spacer has, for example at least one planar area, onto which the resistance thermometer is soldered. The thin-film resistance thermometer is thus, according to an example of an embodiment of the method, soldered onto a planar area of a spacer, before this spacer is inserted into the housing. The spacer is inserted into the housing at least partially between the resistance thermometer and the housing, and/or it is inserted into the housing at least partially between the resistance thermometer and the second end the of housing; that is to say, the spacer assures a certain distance between the resistance thermometer and housing, or between the resistance thermometer and the second end the housing. This distance amounts, for example, to at least 0.5 mm to the second end of the housing or, for example, at least 2 mm. The second end of the housing is, according to an additional further development, tightly sealed with a plug. This is, for example, welded on by means of a laser welding method such that there is a material bond between the plug and the housing. In such case, the plug is not necessarily inserted into the housing; it can also lie against the second end of the housing and be welded with the housing there. The plug can, in such case, also be part of the spacer. Thus, the spacing between the resistance thermometer and the second end of the housing can also as well be produced by the plug. In such an example, the plug is 5 mm thick, or long, and is pushed completely into the housing. The technical purpose of the distance between the resistance thermometer and the second end of the housing lies in the fact that the solder connection between the spacer and resistance thermometer must not be permitted to experience damage from the heat input, when the plug is secured to the housing. Therefore, in an example of an embodiment, the temperature of the solder connection does not become higher than 150° C., when welding the plug onto the housing; in another example of an embodiment, the temperature amounts at its highest to only 100° C. This is achieved, on the one hand, by the spacing between the weld seam and resistance thermometer, and/or, on the other hand, by the use of particular welding methods, such as, for example, tungsten inert gas welding (TIG). Other alternatives to the laser welding method are, for example, the microwelding method, laser soldering or soldering with hard solder (i.e. brazing) or soft solder. Additionally, a lead solder with a higher soldering temperature, e.g. 300° C. or higher, can also be used to solder the resistance thermometer to the planar area of the spacer.

The planar area of the spacer is, in such case, produced by machining; a hole, for example, is cut on a CNC-lathe, or a groove is milled with a side milling cutter. An alternative manufacturing method is an electroerosion method. The planar area is especially an area of a bore or a groove.

This accuracy can, for example, be achieved by a machining manufacturing or working method. With such a method, a dimensional tolerance of up to 1/100 mm is also possible without great effort.

In a drawing, the nominal dimension is usually given. The actual dimension is measurements-technically registered on the workpiece. This should lie between the limit dimensions, the highest measure and the minimum measure. The dimensional tolerance is, in such case, the difference between the allowable highest measure and the allowable minimum measure. Dimensional tolerances thus limit the allowable deviation in the component dimensions. Dimensional tolerances can be given symmetrically, e.g. 40±0.1, or asymmetrically, e.g. 40+0.2/−0.1, or, as in the above example, absolutely and without an associated nominal dimension, e.g. max. 5/100 mm.

In an embodiment, the spacer thus has a cavity (e.g. a bore with a rectangular cross section) which has at least a first planar area onto which the resistance thermometer is applied, wherein the bore is manufactured with a dimensional tolerance of, at most, 5/100 mm. In another embodiment, in contrast, the spacer has a groove, which has at least one planar groove floor onto which the resistance thermometer is applied, wherein the groove is manufactured with a dimensional tolerance of, at most, 5/100 mm.

The spacer itself has a cross section of the same shape as the cross section of the housing. If the housing is tubular, the spacer is then, for example, essentially cylindrical, apart from, for example, possible chamfers or grooves. In a form of embodiment, the longitudinal axis of the spacer lies parallel to the longitudinal axis of the housing, and parallel to the longitudinal axis of the planar area—and thus, for example, of the groove floor. Spacer and housing form a press fit or a transition fit.

Another further development of the method of the invention provides that, before the application of the resistance thermometer to the spacer, preformed solder portions—so-called preform solder—are applied to the resistance thermometer and/or to the planar area of the spacer. Solder portions, which are placed on the planar area of the spacer, are especially matched in size and shape to the planar area of the spacer.

The planar area of the spacer, be it the first planar area of a bore or the groove floor of a groove, is cleaned—thus preventing, for example, that an oxide layer forms (or removing such an oxide layer) if the spacer is manufactured from copper—then a flux is applied, and, finally, the solder (especially the preform solder) is applied. The preform solder portions can also be placed together with the resistance thermometer. According to the invention, an attempt is made, in principle, to keep the solder layer very thin (e.g. smaller than 0.2 mm), as the thermal coupling of the resistance thermometer to the spacer is then very good.

In such case, the spacer with the resistance thermometer and the solder can be inserted into the housing, without their having previously been soldered. If the plug is welded on, the soldering procedure can occur beforehand. If the plug is likewise soldered to the housing, the two steps can occur simultaneously.

If the plug is inserted with a first end of the plug into the housing, as is provided in an example of an embodiment of the invention, the plug then has a chamfer on its first end. The plug protrudes, for example, about 2 mm into the housing, i.e. about 2 mm over the second end the housing into the housing. It forms, as a rule, a press-fit with the housing. In order to be able to be pushed into the housing, the plug is chamfered on its first end. The spacer (which, for example, likewise forms a press fit with the housing) is then pushed in, together with plug. As already is mentioned, an increased heat input into the housing—and, thus, a degrading (e.g. a partial loosening) of a solder connection between the spacer and resistance thermometer—is prevented by laser welding and/or by the structural design of the plug and/or the spacer.

In additional steps of a further developed method of the invention, the housing is produced by a tensile forming method or a compressive forming method (e.g. extruding), or a tensile compressive forming method (for example, by means of deep drawing or drawing through a die). Turned, or welded, housings do not, in a normal case, have the needed dimensional tolerances. However, even these manufacturing methods are not thereby excluded.

By the method of the invention, the filling of a bent housing can be performed without problem. Consequently, in a form of embodiment, the housing is bent, and, indeed, before the filling; that is to say, among other things, the housing is bent before insertion of the resistance thermometer through the second open end.

A further developed sensor of the invention for a thermal flow measuring device has at least one housing with a first end and a second end, wherein the first end is secured in a sensor holder, wherein at least one resistance thermometer is inserted into the housing through the second end of the housing and the second open end the housing is closed, wherein cables for electrical contacting of the resistance thermometer lead out of the housing through the first open end of the housing, and is furthermore characterized in that the housing has a circularly round cross section, and the ratio of the inner diameter of the housing to the breadth of the resistance thermometer amounts to at least 1.5.

In an additional further-developed sensor of the invention, the spacer has a circularly round cross section, wherein the nominal dimension of the inner diameter of the housing is equal to the nominal dimension of the outer diameter of the spacer. The spacer and the housing thus form a press fit. The nominal dimension of the inner diameter of the housing—and thereby also the nominal dimension of the outer diameter of the spacer—amount, in an actual example, to 1.6 mm. In order to push the spacer into the housing, and, in such case, not to shave off material from the spacer (which, for example, is composed of relatively soft copper), the spacer furthermore has a chamfer on that side of the spacer which faces the first open end of the housing. The chamfer also serves to center the spacer before it is pushed in.

In the case of an additional sensor of the invention, the housing is bent.

A typical application for a thermal flow measuring device of the invention with a sensor of the invention is measuring a mass flow of a measured medium flowing through a measuring tube.

BRIEF DESCRIPTION OF THE DRAWINGS

The invention will now be explained in greater detail on the basis of the appended drawing, the figures of which show as follows:

FIG. 3 shows two different sensors for a thermal flow measuring device.

DETAILED DISCUSSION IN CONJUNCTION WITH THE DRAWINGS

Figure 1:
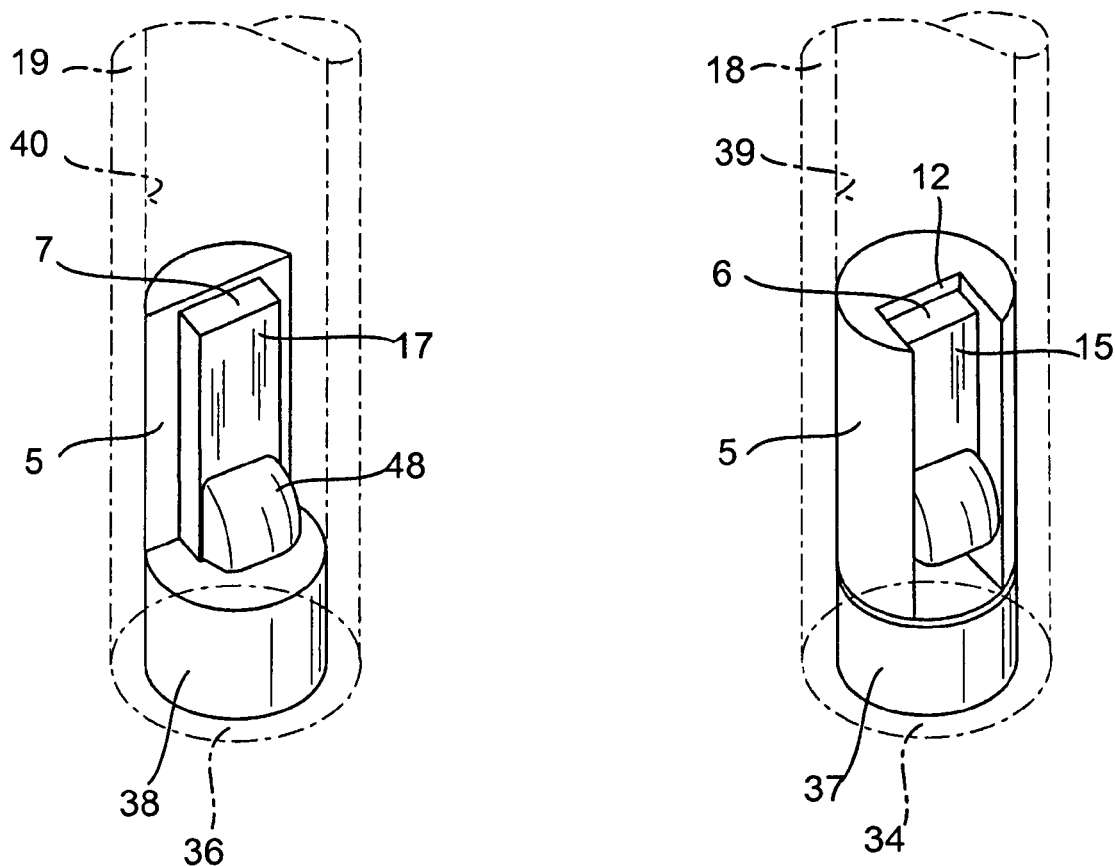
FIG. 1 is a perspective drawing of two different embodiments of sensors for a thermal flow measuring device of the invention.

FIG. 1 shows a perspective representation of a first sensor 2 of a thermal flow measuring device 1. The sensor includes a pin-shaped, first housing 18 having a second end 34, which, during operation, contacts the measured medium. The first end 33 of the pin-shaped, shell housing 18 is secured in a sensor holder. First end 33 is not shown for reasons of perspicuity.

The first plug 37 is welded to the housing 18 at its second end 34. Plug 37 and first spacer 4 form, here, a one-piece, monolithic component. Spacer 4 is in tight-fitting contact with the inner side 39 of the first housing 18. A first resistance thermometer 6 is soldered onto the first spacer 4. The first surface 14 of the resistance thermometer 6 is, thus, tightly fitting with the spacer 4. In this way, good heat conduction from the measured medium to the resistance thermometer 6 is assured. The second surface 15 of the resistance thermometer 6 is exposed to the space bordered by the housing 18.

The second sensor is another embodiment of the sensor of the invention for a thermal flow measuring device. Through the open second end 36 of a second housing 19, a spacer 5 was inserted. This spacer 5 forms a press fit with the housing 19. During assembly, the spacer 5 was pushed by means of a plug 38 in the direction of the first end (not shown) of the housing 19. The plug 38 itself forms a loose fit with the housing 19, and is welded to the housing 19 at its second end 36 by means of a laser welding method. Spacer 5 is composed of a material which conducts heat well. It has the shape of a cylinder with a groove 10 of rectangular cross section. Groove 10 extends over the entire cylinder height in the direction of the longitudinal axis 26. On the "floor" of the groove 10—thus on that surface of the groove 10, to which no other surface of the groove 10 lies opposite—a resistance thermometer 7 is soldered. The second surface 17 of the resistance thermometer 7 is free.

The free space in the housings 18, 19 is preferably filled or potted with a suitable fill material having a low thermal conductivity. In this way, the second surfaces 15, 17 of the resistance thermometer 6, 7 are covered with fill material. The fill material and a contacting of the resistance thermometer 6, 7 with cables (especially via a tension relief 48) are likewise not shown here.

The fill material (also referred to as potting compound) is composed, for example, of a powdered form of a material with a low thermal conductivity, or of a heat insulating paste. Usually, a silicone filling with a thermal conductivity of about 0.2 W/(mK) is used.

This has advantages both in the case of an unheated sensor, as well as in the case of a heated sensor. The first surface 14, 16 of the resistance thermometer 6, 7 is, via the spacer 4, 5—a so called thermal bridge, with very good heat conducting properties—in contact with the measured medium; the oppositely lying, second surface 15, 17 of the resistance thermometer 6, 7 is, however, heat insulated relative to the measured medium. The area, to which a heat transfer takes place (or from which a heat transfer takes place) is exactly defined. There results from this a directional dependence of the temperature sensor. The sensor is sensitive to the flow direction of the measured medium. Additionally, in comparison to the state of the art, the heat losses in the direction of the sensor housing are, in the case of the heated sensor, significantly lower.

The representation in FIG. 1 shows two different options for embodiments of the invention. The heatable resistance thermometer is not limited to the variant shown. Both resistance thermometers are interchangeable.

The spacers 4, 5 likewise have at least two planar surfaces 12, 13. The first surface 12, 13 of the spacer 4, 5, on which the first surface 14, 16 of the resistance thermometer 6, 7 is placed, is embodied in a manner congruent to this latter surface. The first surface 14, 16 of the resistance thermometer 6, 7 and the first surface 12, 13 of the spacer 4, 5 (on which the first surface 14, 16 of the resistance thermometer 6, 7 is placed) thus approximately form a positive and a negative. Equally, the outer side of the spacer 4, 5 is a negative with respect to the inner side 39, 40 of the housing 18, 19. If, then, the inner side 39, 40 of the housing 18, 19 is tubular, the outer side of the spacer 4, 5 is correspondingly curved. Both the first surface 14, 16 of the resistance thermometer 6, 7 and the first planar area 12, 13 of the spacer 4, 5 are tightly fitting, and the outer side of the spacer 4, 5 and the inner side 39, 40 of the housing 18, 19 are also tightly fitting.

Through installation of the resistance thermometer 6, 7 via the respective second end 34, 36 of the housing 18, 19, the position of the resistance thermometer 6, 7 in the housing 18, 19 with respect to the measured medium is reproducible. The spacer 4, 5 assures a predetermined distance between the resistance thermometer 6, 7 and the second end 34, 36 of the housing 18, 19, and/or the inner surface 39, 40 of the housing 18, 19. The housings 18, 19 are drawn here in a pin-shaped form; a housing having a bent shape is not illustrated here.

The plug 37 has a chamfer 46 on its first end, in order to allow it to be pushed into the housing 19.

Figure 2:
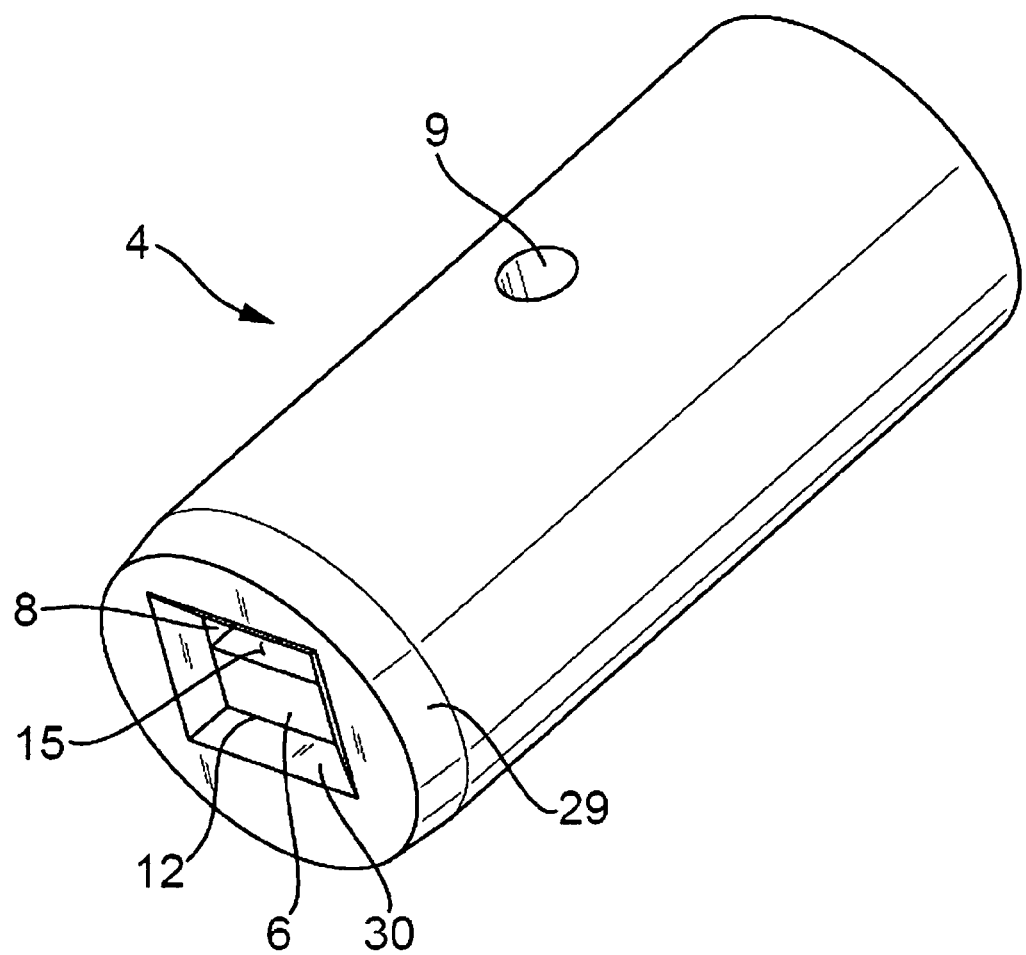
FIG. 2 is a perspective drawing of a spacer of a thermal flow measuring device of the invention.

FIG. 2 is a three-dimensional drawing of a spacer 4 of the invention. Spacer 4 is essentially cylindrical here, having a longitudinal axis (not shown) and a circularly shaped cross section transverse to the longitudinal axis. A first cavity 8 in the spacer 4 extends parallel to the longitudinal axis of the spacer 4, and has a rectangular cross section. The first cavity 8 here traverses the entire lengthwise extent of the spacer 4. Due to the rectangular cross section of the cavity 8, the spacer 4 has altogether four planar surfaces, which bound the cavity 8.

Inserted in the first cavity 8 is a thin-film resistance thermometer 6. The thin-film resistance thermometer 6 includes a first surface and a second surface 15 which lies opposite the first surface. The thin-film resistance thermometer 6 is soldered on its first surface onto the first planar area 12 of the spacer 4, which is thus in thermal contact with the with the resistance thermometer 6.

Extending perpendicular to this first planar area 12 is a second cavity 9 of the spacer; that is to say, a second bore 9 in the spacer 4 has a longitudinal bore axis perpendicular to the first planar area 12 of the spacer 4. During assembly, a hold-down, here in the form of a pin, is caused to extend through this second cavity 9. The hold-down contacts the thin-film resistance thermometer 6 on its second surface 15, and, with a force in the direction of the first planar area 12, presses it onto the first planar area 12, since, to solder on the thin-film resistance thermometer (TFRTD), a certain pressure on thermometer in the direction of the inner wall of the spacer is necessary. In such case, a solder layer is applied between first planar area 12 of the spacer 4 and first surface of the thin-film resistance thermometer 6, by means of which the thin-film resistance thermometer 6 is secured to the spacer 4. After assembly, the hold-down can then be removed, and the second cavity 9 filled with a (here pin-shaped) solid body (which, for example, is produced from the same material as the spacer 4 itself). Alternatively, as in the case of the free space between the second surface 15 of the thin-film resistance thermometer 6 and the spacer 4, which can be filled with fill material, the second cavity 9 can likewise be filled with fill material. For reasons of perspicuity, a depiction of the fill material, as well as a depiction of the cables which electrically contact the resistance thermometers 6 and 7 (especially via a tension relief), is omitted here. The fill material is here composed of a thermally very conductive material.

If the spacer 4 is pushed into a housing in a case where there is a press fit between the spacer 4 and the housing, then the spacer 4 is chamfered to facilitate this. The spacer 4 has a first chamfer 29 on its end pointing toward the first end of the housing, when the spacer 4 is inserted into the housing through a second open end of the housing. Another chamfer 30 facilitates insertion of the thin-film resistance thermometer 6 into the first cavity 8.

FIG. 3 shows two different sensors 2, 3 for a thermal flow measuring device. These are differentiated by the two different spacers 4 and 5, which are installed in the sensors 2 and 3. Regarding the cables 41 for contacting the resistance thermometer 6, 7, it can additionally be seen in FIG. 3 that these cables lead out of the housings 18, 19 through the first open ends 33 and 35.

The invention claimed is:

1. A sensor for a thermal flow measuring device, comprising:
    at least one housing with a first end and a second end, said first end is secured in a sensor holder;
    at least one resistance thermometer inserted into the housing through said second end of said housing and said second open end of said housing is closed; and
    cables for electrical contacting of the resistance thermometer lead out from said housing through the first open end of the housing, wherein:
    said housing has a circularly round cross section, and ratio of inner diameter of said housing to the width of the resistance thermometer amounts to at least 1.5.

2. The sensor for a thermal flow measuring device as claimed in claim 1, wherein:
    said spacer has a circularly round cross section, wherein nominal dimension of the inner diameter of said housing is equal to nominal dimension of the outer diameter of the spacer.

3. The sensor for a thermal flow measuring device as claimed in claim 1, wherein:
    said housing is bent.

\* \* \* \* \*